US007675221B2

(12) United States Patent
Machida et al.

(10) Patent No.: US 7,675,221 B2

(45) Date of Patent: Mar. 9, 2010

(54) ULTRASONIC TRANSDUCER AND MANUFACTURING METHOD THEREOF

(75) Inventors: Shuntaro Machida, Kokubunji (JP); Hiroyuki Enomoto, Musashino (JP); Yoshitaka Tadaki, Hanno (JP); Tatsuya Nagata, Ishioka (JP)

(73) Assignee: Hitachi, Ltd., Tokyo (JP)

( * ) Notice: Subject to any disclaimer, the term of this patent is extended or adjusted under 35 U.S.C. 154(b) by 376 days.

(21) Appl. No.: 11/489,612

(22) Filed: Jul. 20, 2006

(65) Prior Publication Data

US 2007/0052093 A1 Mar. 8, 2007

(30) Foreign Application Priority Data

Sep. 6, 2005 (JP) ............................ 2005-258117

(51) Int. Cl.
*H01L 41/08* (2006.01)

(52) U.S. Cl. ......................... 310/322; 438/48; 438/510; 257/414; 257/419; 257/500; 257/532; 257/533; 600/459; 600/437; 216/17

(58) Field of Classification Search ............. 438/48-99, 438/510-569; 310/322; 257/414, 419, 500, 257/532, 533; 600/459, 437, 101; 367/140; 216/17; 381/191

See application file for complete search history.

(56) References Cited

U.S. PATENT DOCUMENTS

| | | | | |
|---|---|---|---|---|
| 6,320,239 | B1 | 11/2001 | Eccardt et al. | |
| 6,562,650 | B2 | 5/2003 | Ladabaum | |
| 6,571,445 | B2 | 6/2003 | Ladabaum | |
| 7,037,746 | B1 * | 5/2006 | Smith et al. | 438/53 |
| 2007/0052093 | A1 * | 3/2007 | Machida et al. | 257/735 |

OTHER PUBLICATIONS

Webster's Ninth New Collegiate Dictionary p. 1185.*

Yongli Huang, et al., Capacitive Micromachined Ultrasonic Transducers (CMUTS) with Isolation Posts, 2004 IEEE, pp. 2223-2226.

* cited by examiner

*Primary Examiner*—Michael B Shingleton

(74) *Attorney, Agent, or Firm*—Antonelli, Terry, Stout & Kraus, LLP.

(57) ABSTRACT

Disclosed is an improved construction of an ultrasonic transducer, wherein a charge is not easily injected into an insulating film even when the bottom of a membrane comes in contact with a lower electrode, and a manufacturing method thereof without using the wafer laminating technique. The ultrasonic transducer includes a lower electrode; a cavity layer formed on the first electrode; an insulating film covering the cavity layer; and an upper electrode formed on the insulating film, wherein, the cavity layer includes projections formed into an insulating film protruded from the cavity layer. In addition, an opening is formed into the upper electrode, and this upper electrode having the opening formed therein is deposited at a position not being superposed with the projections of the insulating film when seen from the top.

10 Claims, 14 Drawing Sheets

ULTRASONIC TRANSDUCER AND MANUFACTURING METHOD THEREOF

CLAIM OF PRIORITY

The present application claims priority from Japanese application JP 2005-258117 filed on Sep. 6, 2005, the content of which is hereby incorporated by reference into this application.

FIELD OF THE INVENTION

The present invention relates in general to a technique for manufacturing an ultrasonic transducer, more specifically, to the structure of an ultrasonic transducer manufactured by MEMS (Micro Electro Mechanical System) and an effective technique for the manufacture of the same.

BACKGROUND OF THE INVENTION

An ultrasonic transducer transmits and receives an ultrasonic wave and diagnoses a tumor inside a body for example.

Although most of ultrasonic transducers have used the vibration of a piezoelectric body so far, recent advances in the MEMS technique opened up the possibility of using a cMUT (Capacitive Micromachined Ultrasonic Transducer) having a diaphragm formed on a silicon substrate.

For example, U.S. Pat. No. 6,320,239B1 discloses a cell of cMUTs and a CMUT array.

In addition, U.S. Pat. Nos. 6,571,445B2 and 6,562,650B2 disclose techniques for forming cMUT cells on the top of a signal processing circuit built on a silicon substrate.

Moreover, according to 2004 IEEE Ultrasonics Symposium, pp. 2223-2226, a cMUT cell includes a compliant support structure formed on a lower electrode.

SUMMARY OF THE INVENTION

Major advantages associated with the cMUT, compared to the conventional piezoelectric transducer field, is its capability of receiving ultrasonic waves of broader frequency range or ultrasonic waves with a high degree of sensitivity. In addition, since the cMUT is manufactured based on the LSI technology, micron-sized cMUTs can be processed. Especially, in the -case that groups of ultrasonic elements are arranged in an array and that each of the elements needs to be controlled independently, a cMUT becomes an essential part. Considering that a vast number of wires would be required for the respective elements in an array, it is important that a transducer should be able to do wiring as well as packaging an ultrasonic transceiver to a chip of a signal processing circuit. These requirements are met by the cMUT.

With reference to FIG. 1, the following now describes the basic structure and operation of a cMUT. As shown in the drawing, a cavity layer 102 formed on the top of a lower electrode 101 is encompassed by a membrane (insulating film) 103. An upper electrode 104 is disposed at the top of the membrane 103. When a DC voltage and an AC voltage are superposed between the upper electrode 104 and the lower electrode 101, an electrostatic force is generated therebetween and vibrates at the frequency of the AC voltage the membrane 103 and the upper electrode 104 applied, thereby sending an ultrasonic wave.

On the other hand, in case of receiving an ultrasonic wave, the membrane 103 and the upper electrode 104 vibrate by the pressure of the ultrasonic wave reached the surface of the membrane 103. As a result, the distance between the upper electrode 104 and the lower electrode 101 changes, and it become possible to detect the ultrasonic wave as a change of the capacity.

As it is evident from the operating principle described above, transmitting and receiving of an ultrasonic wave are carried out using vibration of the membrane by an electrostatic force due to the application of a voltage between the electrodes and using the change in capacity between the electrodes caused by the vibration. Therefore, stability of voltage difference between the electrodes is very important for achieving a stable operation or for improving reliability of the device.

According to the above-described operating principle, when a DC voltage is applied between the upper electrode 104 and the lower electrode 101, an electrostatic force is generated therebetween and the membrane is deformed. Then, the membrane is stabilized by a variation that balances an elastic restoring force and an electrostatic force.

Typically, a DC voltage that balances the electrostatic force between electrodes and the elastic restoring force of the membrane is used for driving. However, when the applied DC voltage is greater than the so-called collapse voltage of which the variation of the membrane is about ⅓ of the electrode gap, the electrostatic force between electrodes becomes greater than the elastic restoring force of the membrane, so that the membrane cannot be stabilized at a predetermined position and the bottom of the membrane comes in contact with the top of the lower electrode. When this occurs, the membrane is sandwiched between the upper electrode and the lower electrode, and charge is injected from both electrodes, which later becomes a fixed charge inside the film. Even if the DC voltage is applied again between both electrodes, an electric field between the electrodes is blocked by the fixed charge in the insulating film, and a voltage optimally using a cMUT is varied. Therefore, the CMUT disclosed in the U.S. Pat. No. 6,320,239B1, U.S. Pat. No. 6,571,445B2 or U.S. Pat. No. 6,562,650B2 typically uses a voltage substantially lower than the collapse voltage in order to prevent the membrane from getting contact with the lower electrode.

However, to improve the sensitivity of transceiving, the gap between electrodes during the usage of a cMUT should be made as small as possible, and therefore it is important that the voltage applied between both electrodes is close to the collapse voltage as much as possible.

Particularly, 2004 IEEE Ultrasonics Symposium, pp. 2223-2226 discloses a construction having a support structure formed on the lower electrode of a cMUT, and a membrane thereof does not come in contact with the lower electrode even when a voltage greater than the collapse voltage is applied. Unfortunately however, to realize this construction, not only LSI processing technique but also Si wafer laminating technique are necessary, and a special wafer laminating device which is not usually used for a typical LSI process is required. In addition, since two pieces of wafer are used, manufacturing cost is pretty high.

It is, therefore, an object of the present invention to provide an improved construction of an ultrasonic transducer, wherein a charge is not easily injected into an insulating film even when the bottom of a membrane comes in contact with a lower electrode, and a manufacturing method thereof without using the wafer laminating technique.

To achieve the above objects and advantages, there is provided an ultrasonic transducer including: a first electrode; a cavity layer formed on the first electrode; projections of an insulating film formed on the cavity layer; and a second electrode formed on the cavity layer, wherein, at least one of the first electrode and the second electrode is disposed at a position not being superposed with the projections of the insulating film when seen from the top.

Another aspect of the invention provides an ultrasonic transducer, which includes: a first electrode; a cavity layer formed on the first electrode; an insulating film covering the cavity layer; and a second electrode formed on the insulating film, wherein, the cavity layer includes projections formed into an insulating film.

Still another aspect of the invention provides a manufacturing method of an ultrasonic transducer, which includes the steps of: forming a first electrode; forming a sacrifice layer on the first electrode; forming recesses in the sacrifice layer; forming a first insulating film for covering the sacrifice layer and forming projections into the first insulating film by filling up the recesses; forming a second electrode on the first insulating film; forming a second insulating film for covering the second electrode and the first insulating film; forming an opening reaching the sacrifice layer by penetrating the first insulating film and the second insulating film; and forming a cavity layer by removing the sacrifice layer through the opening.

To be brief, a major advantage achieved from the invention is that there is provided an improved construction of an ultrasonic transducer, wherein a charge is not easily injected into an insulating film even when the bottom of a membrane comes in contact with a lower electrode, and a manufacturing method thereof without using the wafer laminating technique.

BRIEF DESCRIPTION OF THE DRAWINGS

The invention will be described in detail with reference to the following drawings in which like reference numerals refer to like elements, and wherein.

DETAILED DESCRIPTION OF THE PREFERRED EMBODIMENTS

Figure 1:
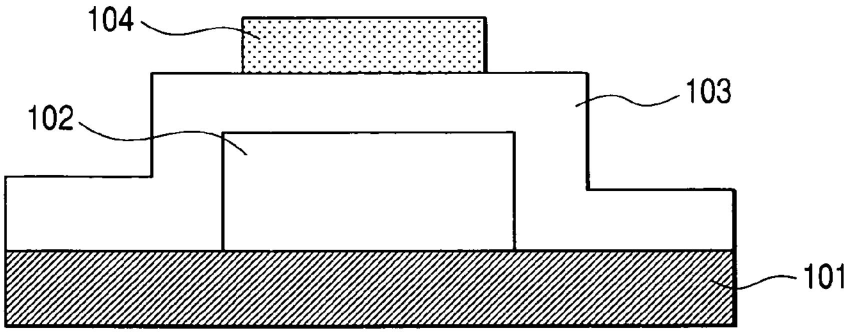
FIG. 1 is a cross-sectional view of an ultrasonic transducer examined by inventors.

A preferred embodiment of the present invention will be described herein below with reference to the accompanying drawings. In the following description, same drawing reference numerals are used for the same elements even in different drawings.

Before explaining the present invention in detail, it should be noted that the invention is not limited in its application or use to the details of construction and arrangement of parts illustrated in the accompanying drawings and description. Rather, the illustrative embodiments of the invention may be implemented or incorporated in other embodiments, variations and modifications, and may be practiced or carried out in various ways.

Furthermore, unless otherwise indicated, the terms and expressions employed herein have been chosen for the purpose of describing the illustrative embodiments of the present invention for the convenience of the reader and are not for the purpose of limiting the invention.

Also, to maximize the understanding of a plan view for example, hatching was used.

The following embodiment suggests an ultrasonic transducer without charge injection into an insulating film between electrodes, which is realized by forming projections in the insulating film and depositing the projections and the electrodes in positions where they are not superposed when seen from the top.

First Embodiment

Figure 2:
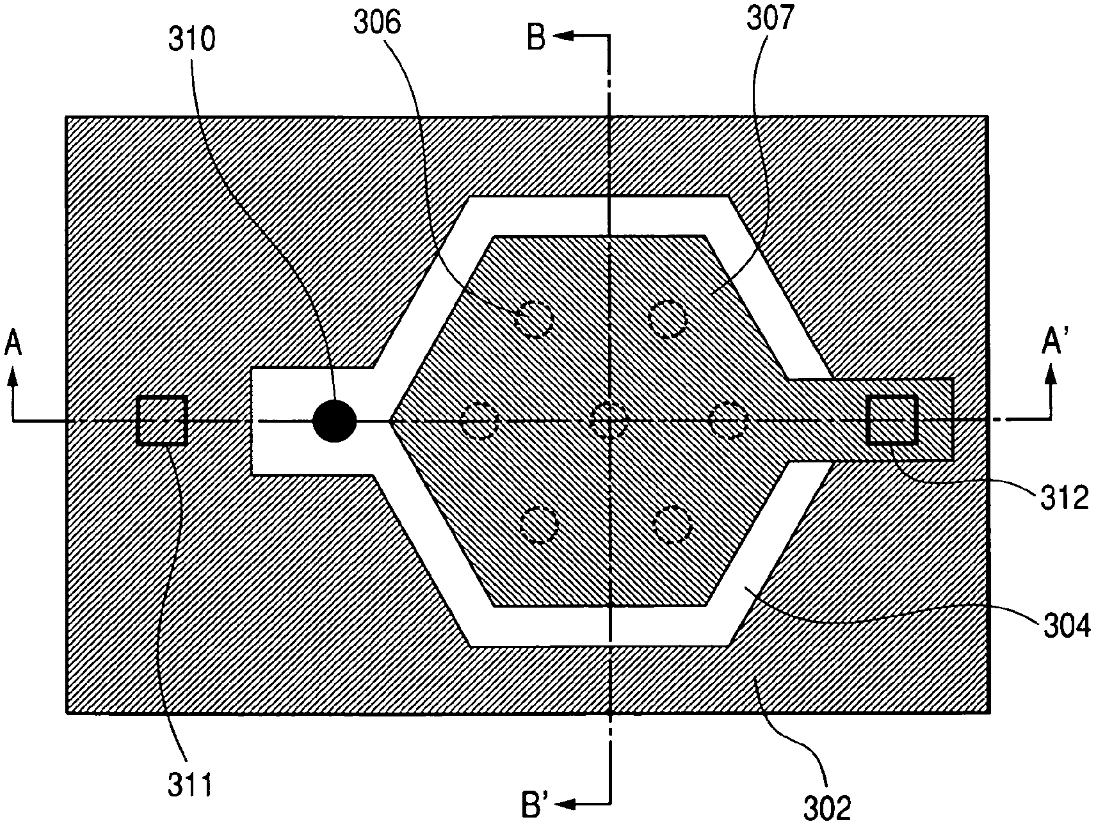
FIG. 2 is a top view of an ultrasonic transducer, according to a first embodiment of the invention.

FIG. 2 is a top view of an ultrasonic transducer (cMUT) according to a first embodiment of the invention. In particular, FIG. 2 illustrates a cMUT, which includes a lower electrode (a first electrode) 302, a cavity layer 304 formed on the lower electrode 302, projections of an insulating film formed on the cavity layer 304, and an upper electrode (a second electrode) 307 formed on the cavity layer 304. Reference numeral 310 in the drawing denotes a wet etching hole for forming a cavity.

That is, the wet etching hole 310 is connected to the cavity layer 304 forming the cavity. Reference numeral 311 denotes an opening connected to the lower electrode 302, and reference numeral 312 denotes an opening connected to the upper electrode 307. Although the insulating film is formed between the upper electrode 307 and the cavity layer 304 in a way to cover the cavity layer 304 and the lower electrode 302, it is not shown in the drawing to show the cavity layer 304 and the lower electrode 302. The projections 306 formed on the insulating film are actually located below the upper electrode 307, so it is not seen from the top. However, to maximize understanding of the structure of a cMUT, it is shown in FIG. 2.

Figure 3A:
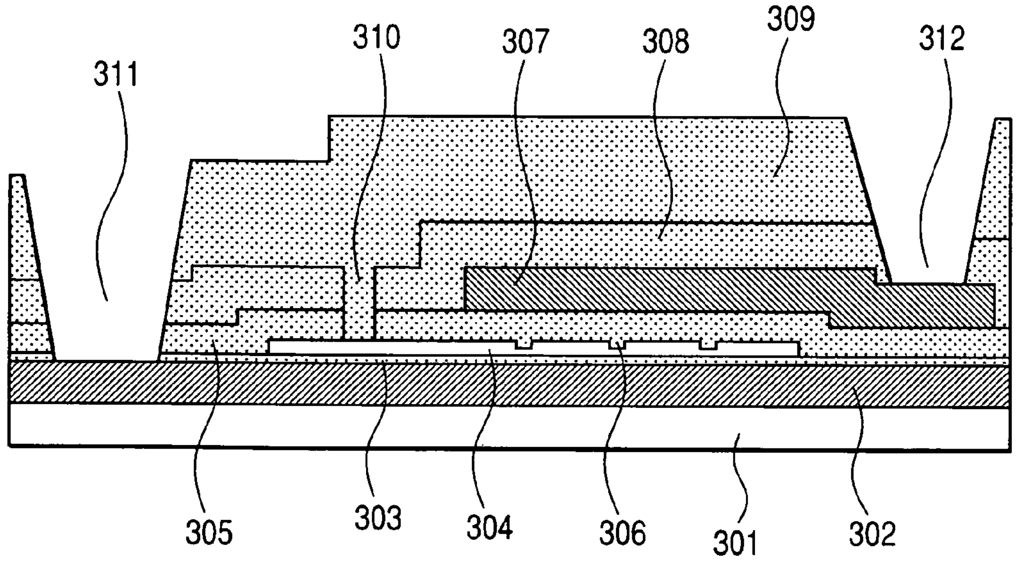
FIG. 3*a* is a cross-sectional view taken along line A-A' in FIG. 2.
Figure 3B:
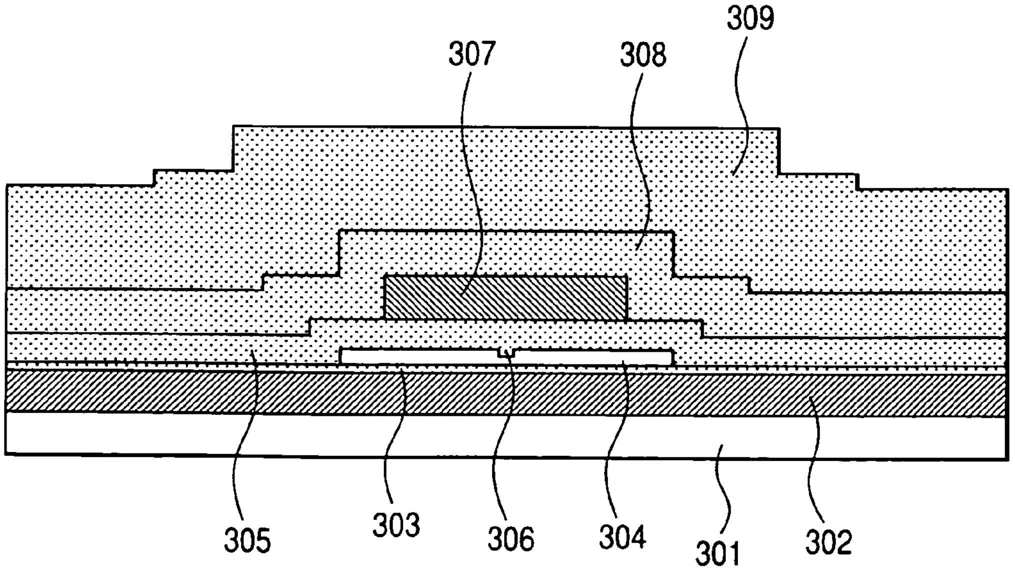
FIG. 3*b* is a cross-sectional view taken along line B-B' in FIG. 2.

FIG. 3*a* is a cross-sectional view taken along line A-A' in FIG. 2, and FIG. 3*b* is a cross-sectional view taken along line B-B' in FIG. 2. As shown in the drawings, the lower electrode 302 of the cMUT is formed on the insulating film 303 formed on a semiconductor substrate. The cavity layer (a cavity) 304 is formed on the top of the lower electrode 302 through an insulating film 303. An insulating film (a first insulating film) 305 is formed to encompass the cavity layer 304, and the upper electrode 307 is formed on the top of the insulating film 305. The projections 306 are formed on the cavity layer 304 from the lower surface of the insulating film 305. An insulating film (a second insulating film) 308 and an insulating film 309 are formed on the top of the upper electrode 307. Also, a wet etching hole 310 is formed into the insulating film 305 and the insulating film 308, passing through these films. This wet etching hole 310 is provided to form the cavity layer 304, and once the cavity layer 304 is formed it is filled up with the insulating film 309. Reference numerals 311 and 312 denote openings for supplying a voltage to the lower electrode 302 and the upper electrode 307, respectively.

As shown in FIG. 2 and FIGS. 3*a* and 3*b*, the first embodiment is characterized in that the projections 306 protruded in the cavity layer 304 are formed on the lower surface of the insulating film 305. With this structure, although a voltage making the lower surface of the insulating film 305 come in contact with the insulating film 303 that covers the upper surface of the lower electrode 302 is applied to the upper electrode 307 and the lower electrode 302, the projections 306 function as a support structure and it is possible to prevent the entire lower surface of the insulating film 305 from contacting the insulating film 303 that covers the lower electrode 302. That is, in the case that no projection 306 is formed, the entire lower surface of the insulating film 305 comes in contact with the insulating film 303 covering the lower electrode 302, and a charge is injected to the insulating films 305 and 303 throughout the entire area of the contact portion, thereby causing a substantial change in the voltage being used. However, according to the first embodiment of the invention, the projections 306 formed on the lower surface of the insulating film 305 function as a support structure, so that the entire lower surface of the insulating film 305 does not contact the insulating film 303 covering the lower electrode 302 and the amount of charge injection into the insulating films 305 and 303 can be reduced. This, in turn, brings an improvement in the operating reliability of the cMUT.

The following now explains a manufacturing method of the cMUT suggested in the first embodiment of the invention. FIGS. 4 to 13 are cross-sectional views showing the manufacturing process of the cMUT. In particular, (a) portions in the respective drawings illustrate cross-sectional views taken along line A-A' in FIG. 2, while (b) portions in the respective drawings illustrate cross-sectional views taken along line B-B' in FIG. 2.

Figure 4A:
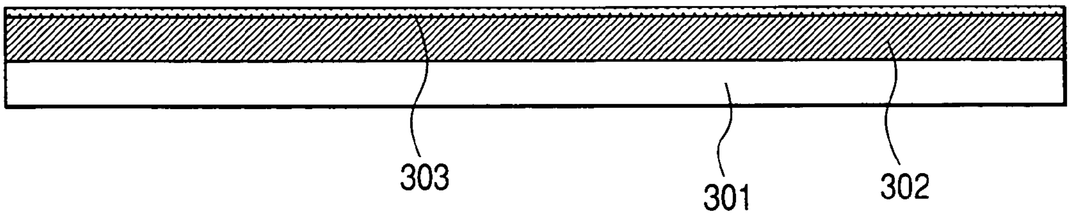
FIG. 4*a* is a cross-sectional view showing the manufacturing process of a cMUT in the cross-sectional view taken along line A-A' in FIG. 2.
Figure 4B:
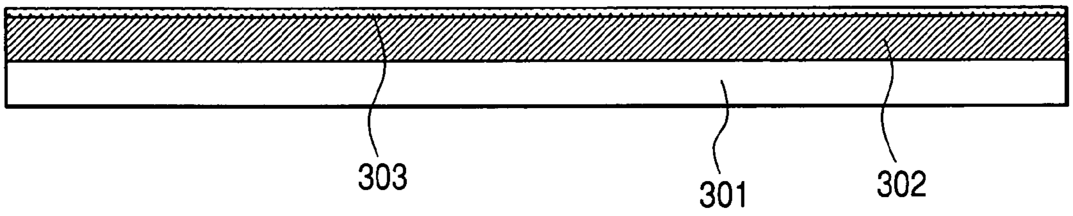
FIG. 4*b* is a cross-sectional view showing the manufacturing process of a cMUT in the cross-sectional view taken along line B-B' in FIG. 2.
Figure 5A:
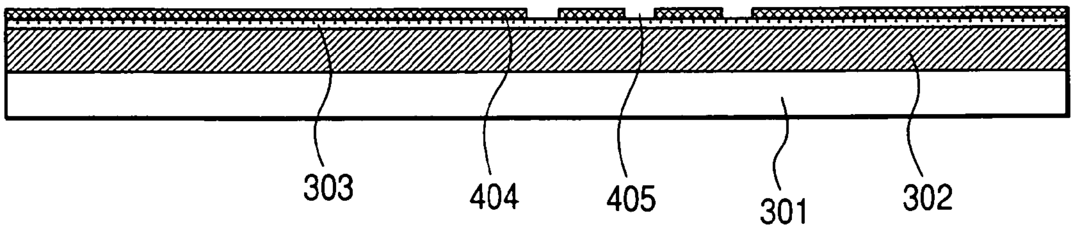
FIG. 5*a* is a cross-sectional view showing the manufacturing process of a cMUT in continuation of FIG. 4*a*, and FIG. 5*b* a cross-sectional view showing the manufacturing process of a cMUT in continuation of FIG. 4*b;*
Figure 5B:
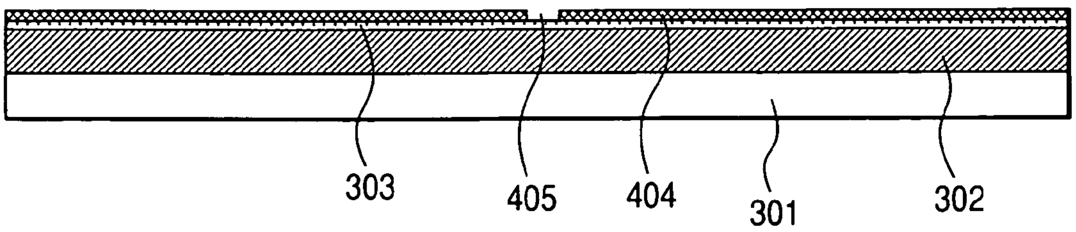
Figure 6A:
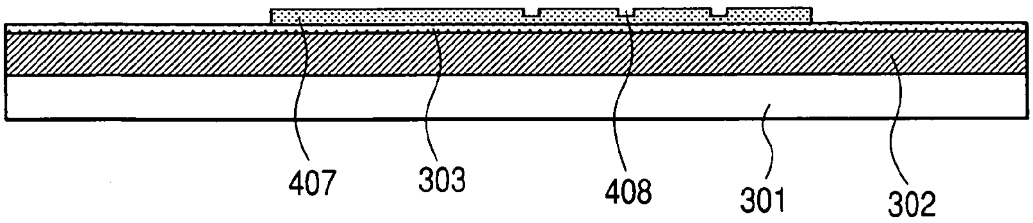
FIG. 6*a* is a cross-sectional view showing the manufacturing process of a cMUT in continuation of FIG. 5*a*, and FIG. 6*b* a cross-sectional view showing the manufacturing process of a cMUT in continuation of FIG. 5*b;*
Figure 6B:
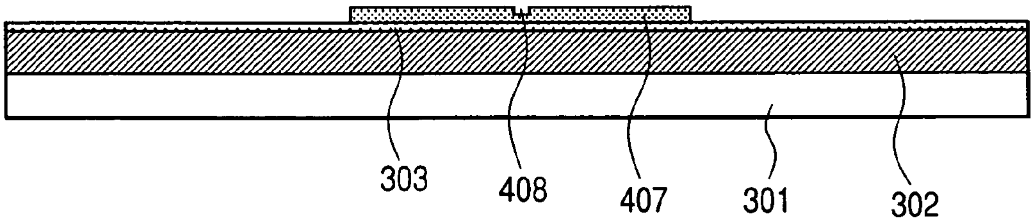
Figure 7A:
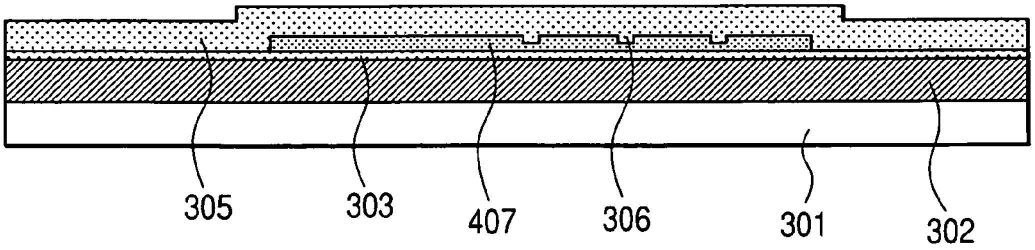
FIG. 7*a* is a cross-sectional view showing the manufacturing process of a cMUT in continuation of FIG. 6*a*, and FIG. 7*b* a cross-sectional view showing the manufacturing process of a cMUT in continuation of FIG. 6*b;*
Figure 7B:
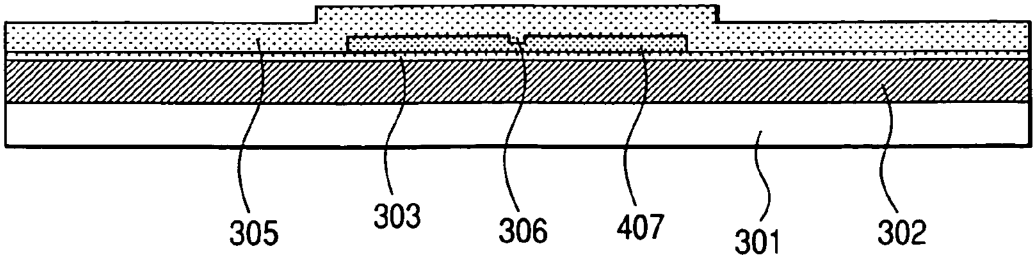
Figure 8A:
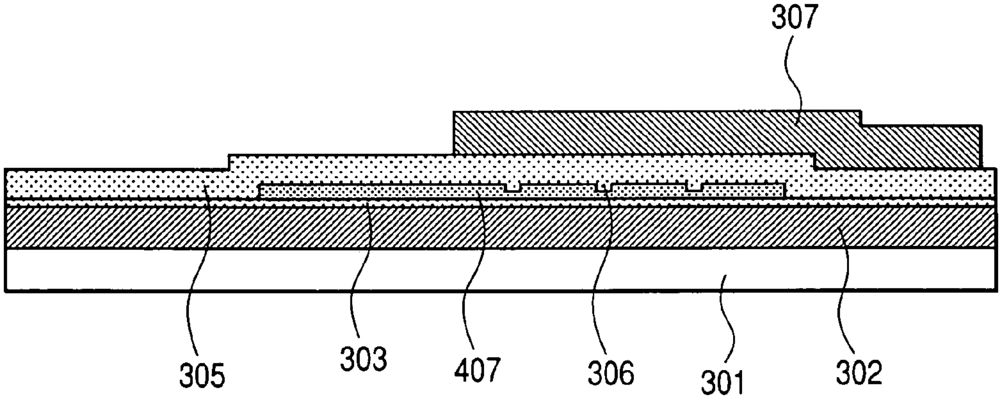
FIG. 8*a* is a cross-sectional view showing the manufacturing process of a cMUT in continuation of FIG. 7*a*, and FIG. 8*b* a cross-sectional view showing the manufacturing process of a cMUT in continuation of FIG. 7*b;*
Figure 8B:
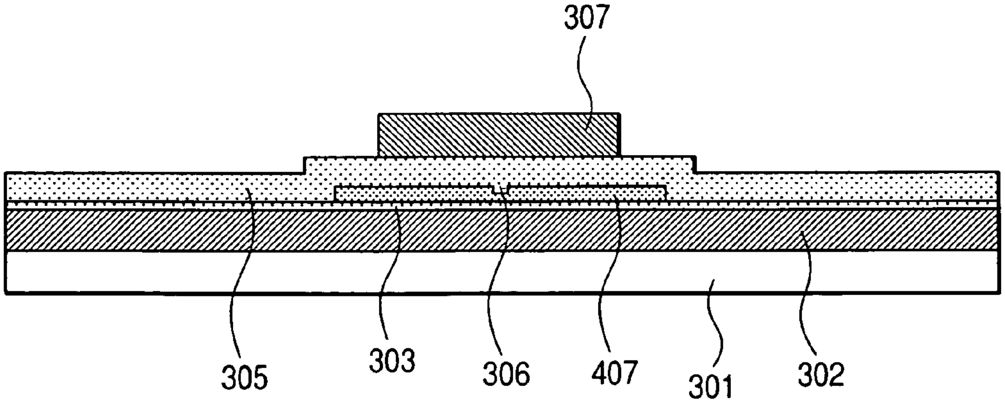

As shown in FIGS. 4*a* and 4*b*, the insulating film 302 made of silicon oxide film and the lower electrode 302 that is formed by sequentially depositing a titan nitride film, an aluminum alloy film and a titan nitride film are formed on a semiconductor substrate. And, the insulating film 303 containing silicon oxide is deposited on the lower electrode 302 by CVD (Chemical Vapor Deposition) until a desired thickness 50 nm is achieved.

Next, a polycrystalline silicon film 404 is deposited on the upper surface of the insulating film 303 by CVD until a desired thickness 50 nm is achieved. In addition, an opening 405 is formed into the polycrystalline silicon film 404 by photolithography technique and dry etching technique (refer to FIGS. 5*a* and 5*b*).

A polycrystalline silicon film is again deposited on the upper surface of the polycrystalline silicon film 404 and the opening 405 by DVD until a desired thickness 50 nm is achieved. Then, photolithography technique and dry etching technique are applied again to leave the polycrystalline silicon film only. This left portion forms a sacrifice layer 407, which becomes a cavity in the subsequent process. The opening 405 in FIG. 5 becomes a recess 408 formed on the sacrifice layer 407 by depositing the polycrystalline silicon film (refer to FIGS. 6*a* and 6*b*).

Next, the insulating film 305 containing silicon oxide is deposited to a thickness of 200 nm by plasma CVD to cover the sacrifice layer 407, the insulating film 303 containing silicon oxide and the recess 408. At this time, the recess 408 is filled up with the insulating film 305 containing silicon oxide, and the projections 306 are formed on the lower surface of the insulating film 305 (refer to FIGS. 7*a* and 7*b*).

Later, to form the upper electrode of the cMUT, the titan nitride film, the aluminum alloy film, and the titan nitride film are sequentially deposited by sputtering to 50 nm, 300 nm, and 50 nm in thickness, respectively. Then, the upper electrode 307 is formed by using photolithography technique and drying etching technique.(refer to FIGS. 8*a* and 8*b*).

Figure 9A:
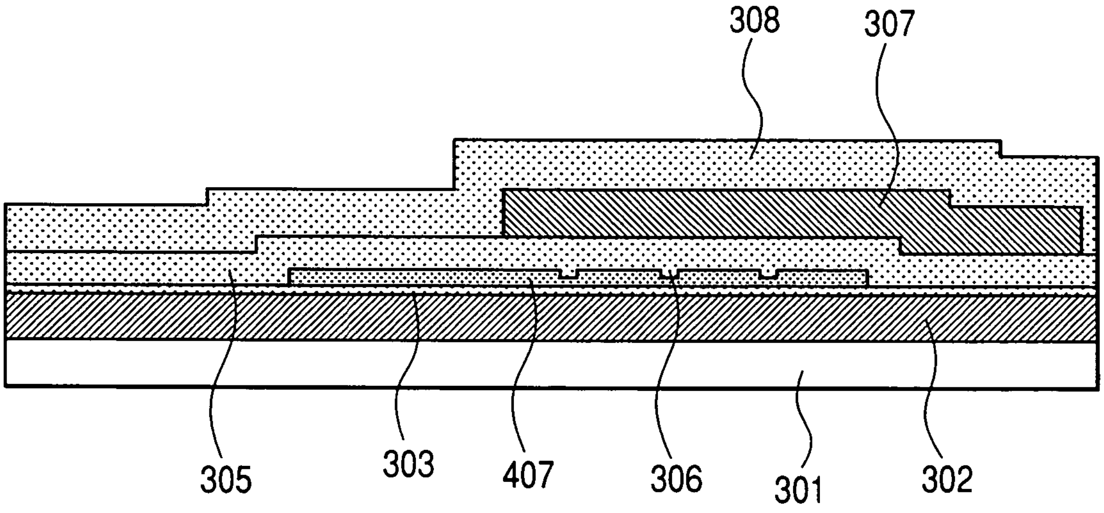
FIG. 9*a* is a cross-sectional view showing the manufacturing process of a cMUT in continuation of FIG. 8*a*, and FIG. 9*b* a cross-sectional view showing the manufacturing process of a cMUT in continuation of FIG. 8*b;*
Figure 9B:
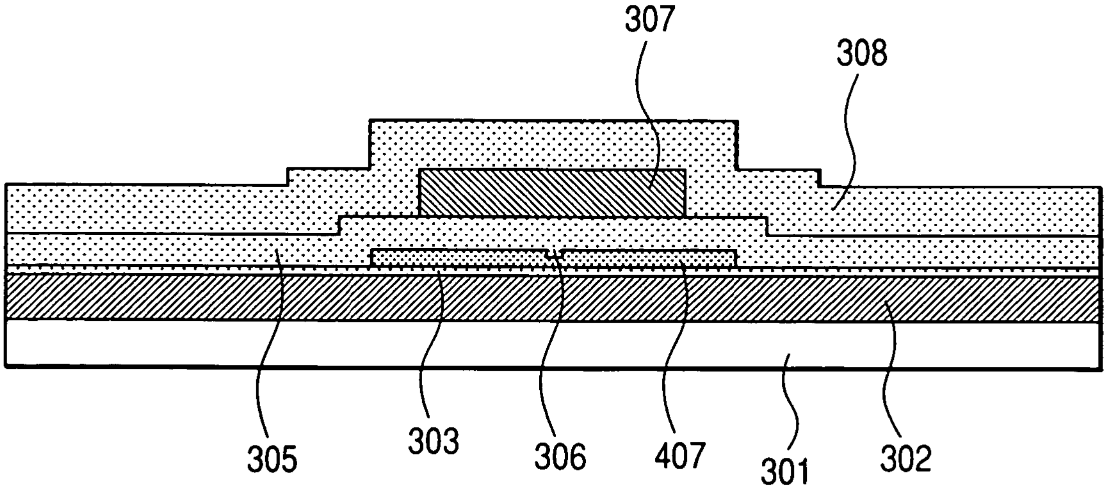
Figure 10A:
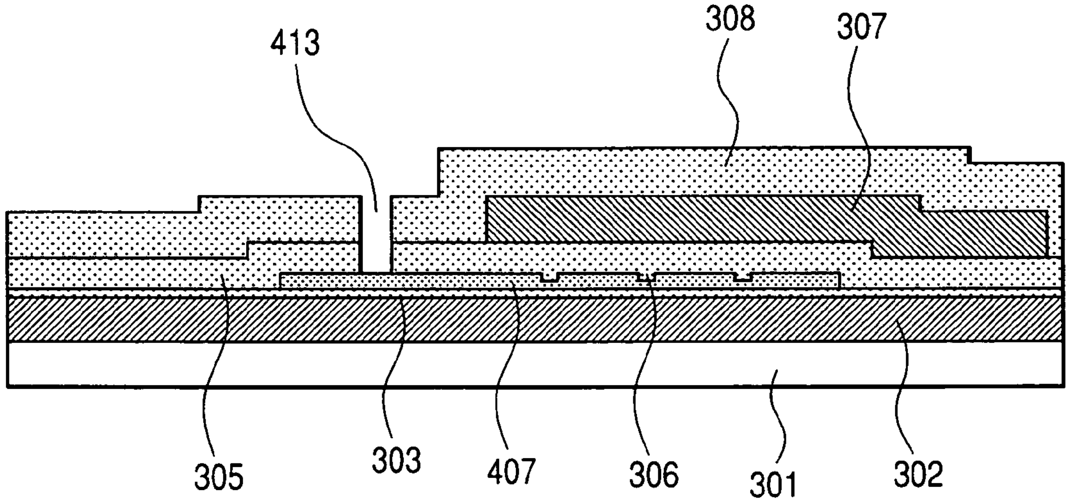
FIG. 10*a* is a cross-sectional view showing the manufacturing process of a cMUT in continuation of FIG. 9*a*, and FIG. 10*b* a cross-sectional view showing the manufacturing process of a cMUT in continuation of FIG. 9*b;*
Figure 10B:
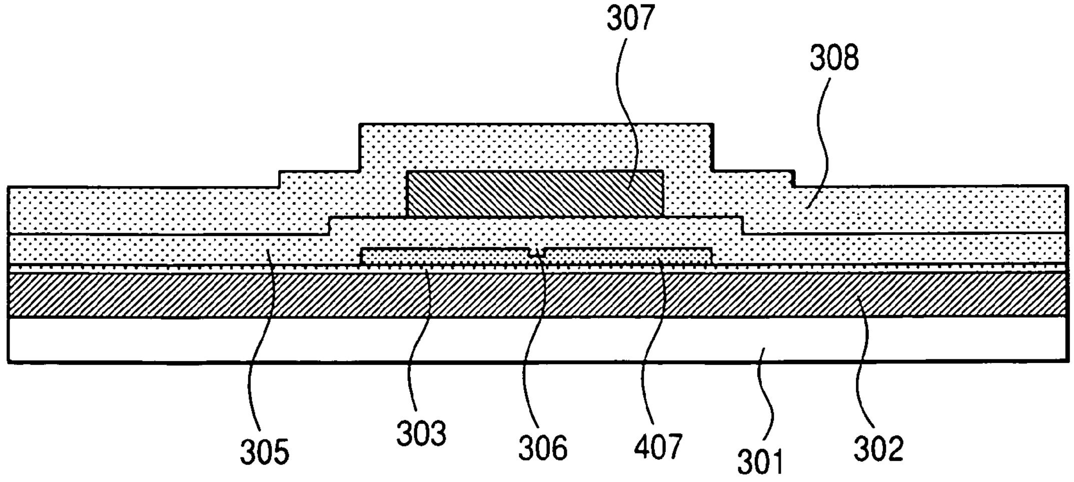

Next, the insulating film 308 containing silicon nitride is deposited by plasma CVD to 300 nm in thickness in order to cover the insulating film 305 containing silicon oxide and the upper electrode 307 (refer to FIGS. 9*a* and 9*b*).

Further, an opening 413 reaching the sacrifice layer 407 is formed into the insulating film 308 containing silicon nitride and the insulating film 305 containing silicon oxide. (refer to FIGS. 10*a* and 10*b*) by using photolithography technique and dry etching technique.

Figure 11A:
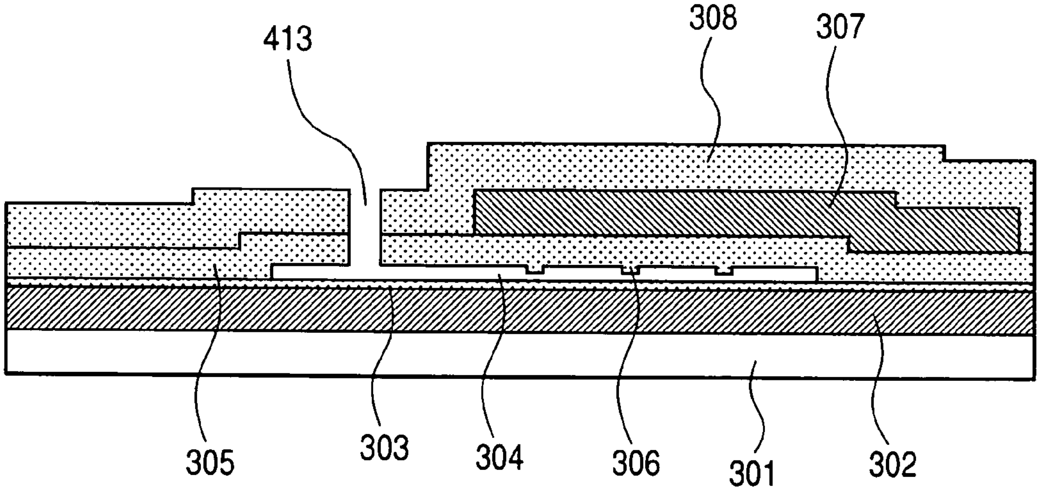
FIG. 11*a* is a cross-sectional view showing the manufacturing process of a cMUT in continuation of FIG. 10*a*, and FIG. 11*b* a cross-sectional view showing the manufacturing process of a cMUT in continuation of FIG. 10*b;*
Figure 11B:
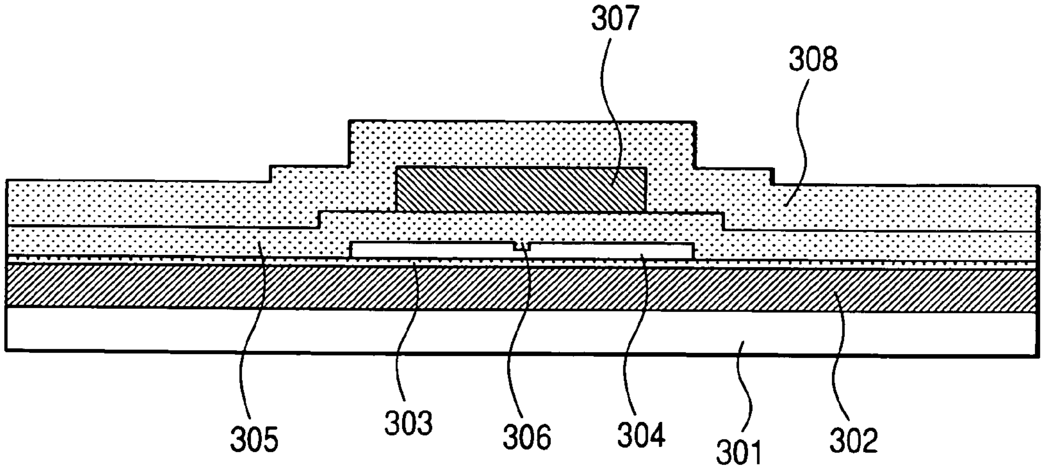

Next, the cavity layer (cavity) 304 is formed by wet etching the sacrifice layer 406 with potassium hydroxide through the opening 413 (refer to FIGS. 11*a* and 11*b*).

Figure 12A:
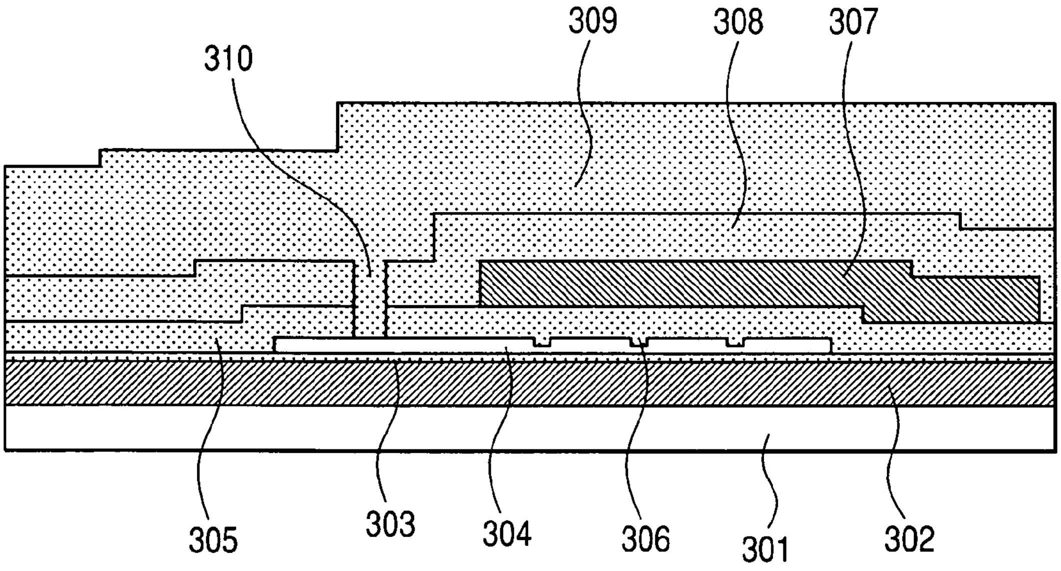
FIG. 12*a* is a cross-sectional view showing the manufacturing process of a cMUT in continuation of FIG. 11*a*, and FIG. 12*b* a cross-sectional view showing the manufacturing process of a cMUT in continuation of FIG. 11*b;*
Figure 12B:
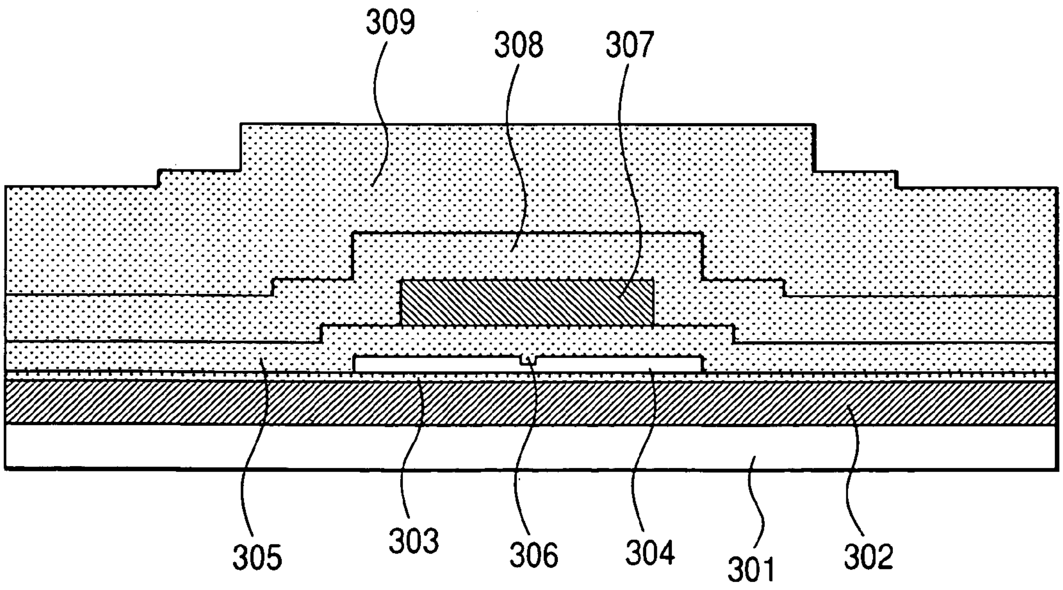

In order to fill up the opening 413, an insulating film 309 containing silicon nitride is deposited to about 800 nm in thickness by plasma CVD (refer to FIGS. 12*a* and 12*b*).

Figure 13A:
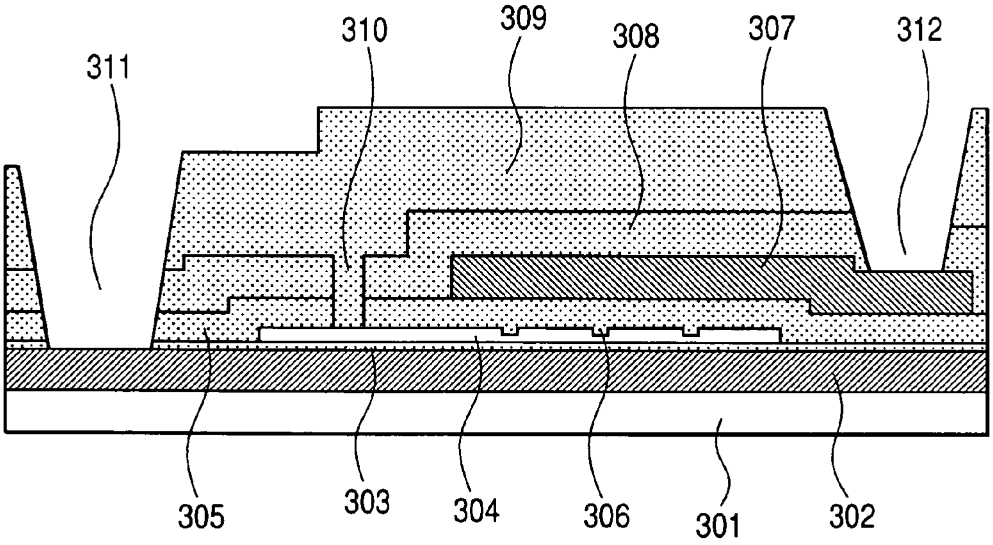
FIG. 13*a* is a cross-sectional view showing the manufacturing process of a cMUT in continuation of FIG. 12*a*, and FIG. 13*b* a cross-sectional view showing the manufacturing process of a cMUT in continuation of FIG. 12*b;*
Figure 13B:
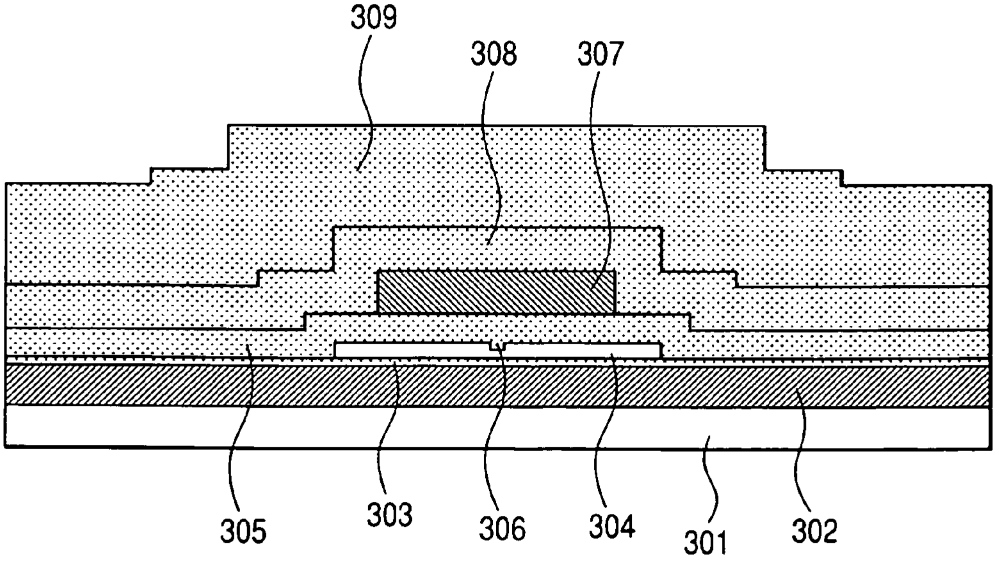

Afterwards, the openings 311 and 312 through which a voltage is supplied to the lower electrode 302 and the upper electrode 307 are formed by dry etching technique (refer to FIGS. 13*a* and 13*b*). In this manner, the cMUT of the first embodiment shown in FIGS. 3*a* and 3*b* is manufactured.

As explained so far, according to the cMUT of the first embodiment of the invention, although the membrane (insulating film 305) contacts the lower electrode 302, their contact area is reduced by the projections 306 formed on the insulating film 305, and charge injection into the insulating films 305 and 306 can be suppressed, thereby decreasing the variation of a voltage being used. In result, it is now possible to drive a cMUT with a voltage around the collapse voltage and the sensitivity of the cMUT can be enhanced.

In addition, without using a complicated technique, such as wafer laminating technique, cost-effective cMUTs can be manufactured.

In FIG. 2, although the cMUT has a hexagonal shape, the shape is not limited thereto but other shapes like a circular shape can be used as well.

Moreover, although seven projections are formed on the cavity, their arrangement is not limited to the one shown in the drawing as long as the projections function as a support structure for preventing the membrane from contacting the lower electrode in the case that a voltage greater than the collapse voltage is applied between the upper electrode and the lower electrode.

In addition, materials of the CMUT of the first embodiment of the invention is one of their combinations. And, tungsten or other conductive materials can be used as materials of the upper electrode and the lower electrode. Also, the sacrifice layer may be made from a material which can secure wet etching selectivity with other materials surrounding the sacrifice layer. Therefore, an SOG (Spin-on-Glass) film or a metallic film may be used in replacement of the polycrystalline silicon film.

According to the manufacturing method for the first embodiment of the invention, a cMUT can be manufactured on any planar surface. This means that the lower electrode can be a Si substrate, and part of the LSI wiring can be used as the lower electrode.

Second Embodiment

A cMUT of the second embodiment is characterized in that projections on the insulating film in the cavity between electrodes and the electrode (upper electrode) are not overlapped.

Figure 14:
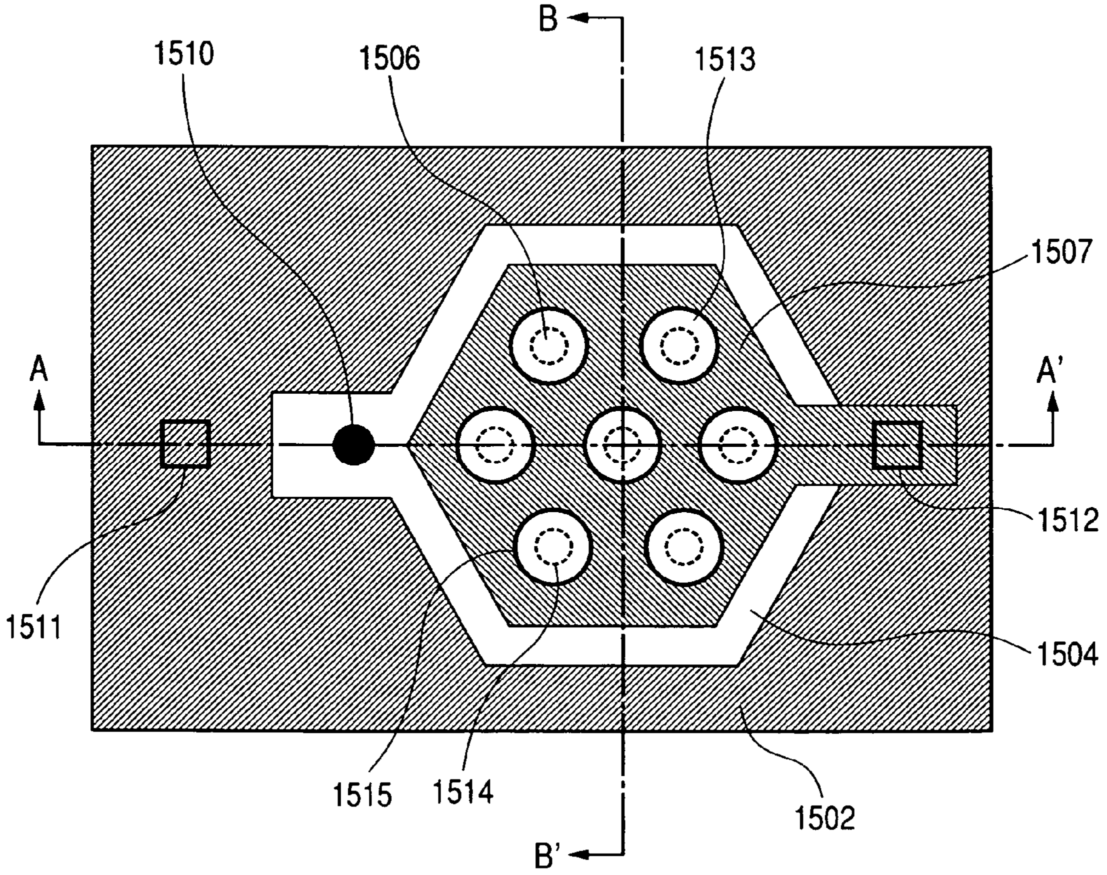
FIG. 14 is a top view of a cMUT according to a second embodiment of the invention.

FIG. 14 is a top view of a cMUT according to the second embodiment of the invention. In the drawing, reference numeral 1502 denotes a lower electrode, 1504 denotes a cavity layer, 1507 denotes an upper electrode, and 1510 denotes a wet etching hole for forming the cavity. That is, the wet etching hole 1510 is connected to the cavity layer 1504 forming a cavity. Reference numeral 1511 denotes an opening connected to the lower electrode 1502, and reference numeral 1512 denotes an opening connected to the upper electrode 1507. Although the insulating film is formed between the upper electrode 1507 and the cavity layer 1504 in a way to cover the cavity layer 1504 and the lower electrode 1502, it is not shown in the drawing to show the cavity layer 1504 and the lower electrode 1502. Reference numeral 1506 denotes projections formed on the insulating film, and reference numeral 1513 denotes an opening formed on the upper electrode 1507. An opening 1513 is formed not to be superposed with the projections 1506. Reference numeral 1514 denotes an outer peripheral surface of the projections 1506, and reference numeral 1513 denotes an inner peripheral surface of the opening 1513.

Figure 15A:
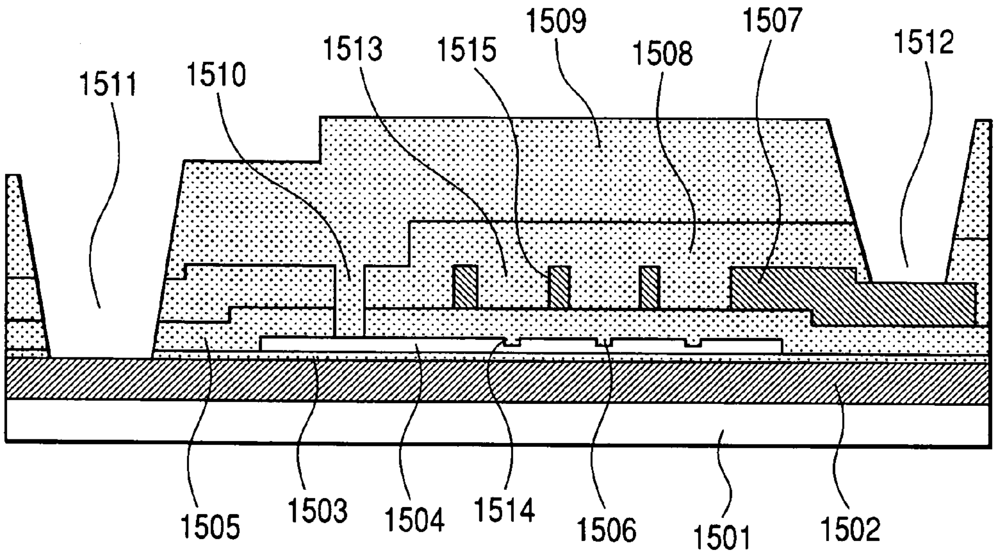
FIG. 15*a* is a cross-sectional view taken along line A-A' in FIG. 14.
Figure 15B:
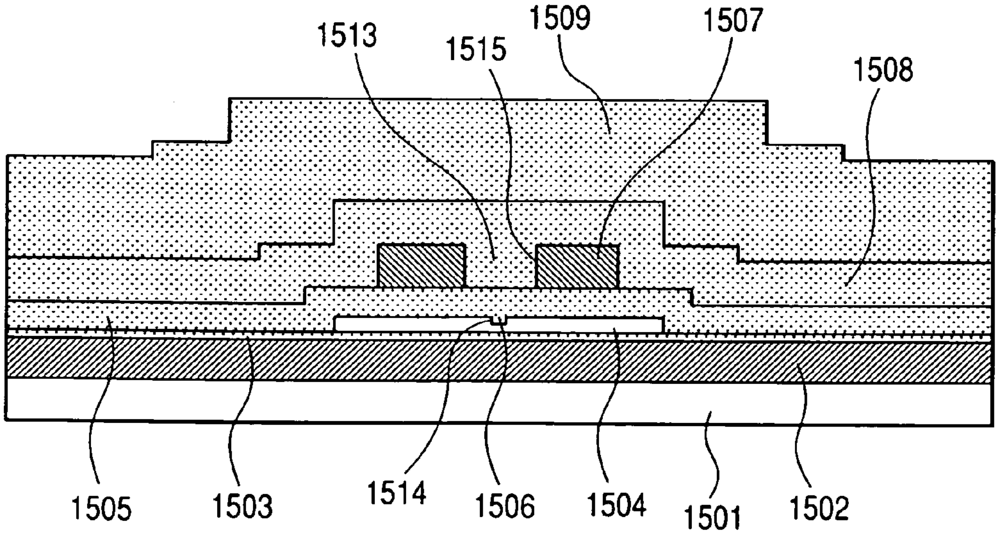
FIG. 15*b* is a cross-sectional view taken along line B-B' in FIG. 14.

FIG. 15*a* is a cross-sectional view taken along line A-A' in FIG. 14, and FIG. 15*b* is a cross-sectional view taken along line B-B' in FIG. 14. As shown in the drawings, the lower electrode 1502 of the cMUT is formed on the insulating film 1501 formed on a semiconductor substrate. The cavity layer (a cavity) 1504 is formed on the top of the lower electrode 1502 through an insulating film 1503. An insulating film 1505 is formed to encompass the cavity layer 1504, and the upper electrode 1507 is formed on the top of the insulating film 1505. The projections 1506 are formed on the cavity layer 1504 from the lower surface of the insulating film 1505. The opening 1513 is formed in the upper electrode 1507 on the top of the projections 1506. An insulating film 1508 and an insulating film 1509 are formed on the top of the upper electrode 1507. Also, a wet etching hole 1510 is formed into the insulating film 1505 and the insulating film 1508, passing through these films. This wet etching hole 1510 is provided to form the cavity layer 1504, and once the cavity layer 1504 is formed it is filled up with the insulating film 1509. Reference numerals 1511 and 1512 denote openings for supplying a voltage to the lower electrode 1502 and the upper electrode 1507, respectively. Reference numeral 1514 denotes an outer peripheral surface of the projections 1506, and reference numeral 1515 denotes an inner peripheral surface of the opening 1513.

As shown in FIG. 14 and FIGS. 15*a* and 15*b*, the second embodiment is characterized in that the opening 1513 is formed into the upper electrode 1507 on the top of the projections 1506 that are protruded in the cavity layer 1504 on the lower surface of the insulating film 1505. With this structure, although a voltage making the lower surface of the insulating film 1505 come in contact with the insulating film 1503 that covers the upper surface of the lower electrode 1502 is applied to the upper electrode 1507 and the lower electrode 1502, the projections 1506 function as a support structure and it is possible to prevent the entire lower surface of the insulating film 1505 from contacting the insulating film 1503 that covers the lower electrode 1502. Moreover, by forming the opening 1513 into the upper electrode 1507, although the projections 1506 serve as a support structure, they are not inserted between the upper electrode 1507 and the lower electrode 1502, and charge injection into the insulating films 1505 and 1503 of the projections 1506 can be substantially reduced. This, in turn, brings an improvement in the operating reliability of the cMUT.

Preferably, the distance from the outer peripheral surface 1514 of the projections 1506 to the inner peripheral surface 1515 of the opening 1513 seen from the top is set to be greater than the thickness of the insulating film 1505. By this, an electric field at the projections 1506 by the upper electrode 1507 and the lower electrode 1502 is much reduced and charge injection into the projections 1506 can be reduced a lot.

Now that the manufacturing method of the cMUT according to the second embodiment of the invention is almost identical with that of the first embodiment, except that the opening 1513 is formed into the upper electrode 1507 on the top of the projections 1506, the explanation of the identical parts of the method will be omitted. The opening 1513 is formed into the upper electrode 1507 by photolithography technique and dry etching technique.

As explained so far, according to the cMUT of the second embodiment of the invention, although the membrane (insulating film 1505.) contacts the lower electrode 1502, their contact area is reduced by the projections 1506 formed on the insulating film 1505, and charge injection into the insulating films 1505 and 1506 can be suppressed, thereby decreasing the variation of a voltage being used. Moreover, by arranging the projections 1506 and the upper electrode 1507 in a manner not to be superposed with each other, charge injection from the upper and lower electrodes 1507 and 1502 to the projections 1506 of the insulating films 1505 and 1503 can be prevented. In result, it is now possible to drive a cMUT with a voltage close to the collapse voltage and the sensitivity of the cMUT can be enhanced.

In addition, without using a complicated technique, such as wafer laminating technique, cost-effective cMUTs can be manufactured.

In FIG. 14, although the cMUT has a hexagonal shape, the shape is not limited thereto but other shapes like a circular shape can be used as well.

Moreover, although seven projections and the opening are formed in the cavity, their arrangement is not limited to the one shown in the drawing as long as the projections serve as a support structure for preventing the membrane from contacting the lower electrode in the case that a voltage greater than the collapse voltage is applied between the upper electrode and the lower electrode.

In addition, materials of the CMUT of the second embodiment of the invention is one of their combinations. And, tungsten or other conductive materials can be used as materials of the upper electrode and the lower electrode. Also, the sacrifice layer may be made from a material which can secure wet etching selectivity with other materials surrounding the sacrifice layer. Therefore, an SOG (Spin-on-Glass) film or a metallic film may be used in replacement of the polycrystalline silicon film.

According to the manufacturing method for the second embodiment of the invention, a cMUT can be manufactured on any planar surface. This means that the lower electrode can be a Si substrate, and part of the LSI wiring can be used as the lower electrode.

Third Embodiment

A cMUT of the third embodiment is characterized in that projections on the insulating film in the cavity between electrodes and the electrode (lower electrode) are not superposed.

Figure 16:
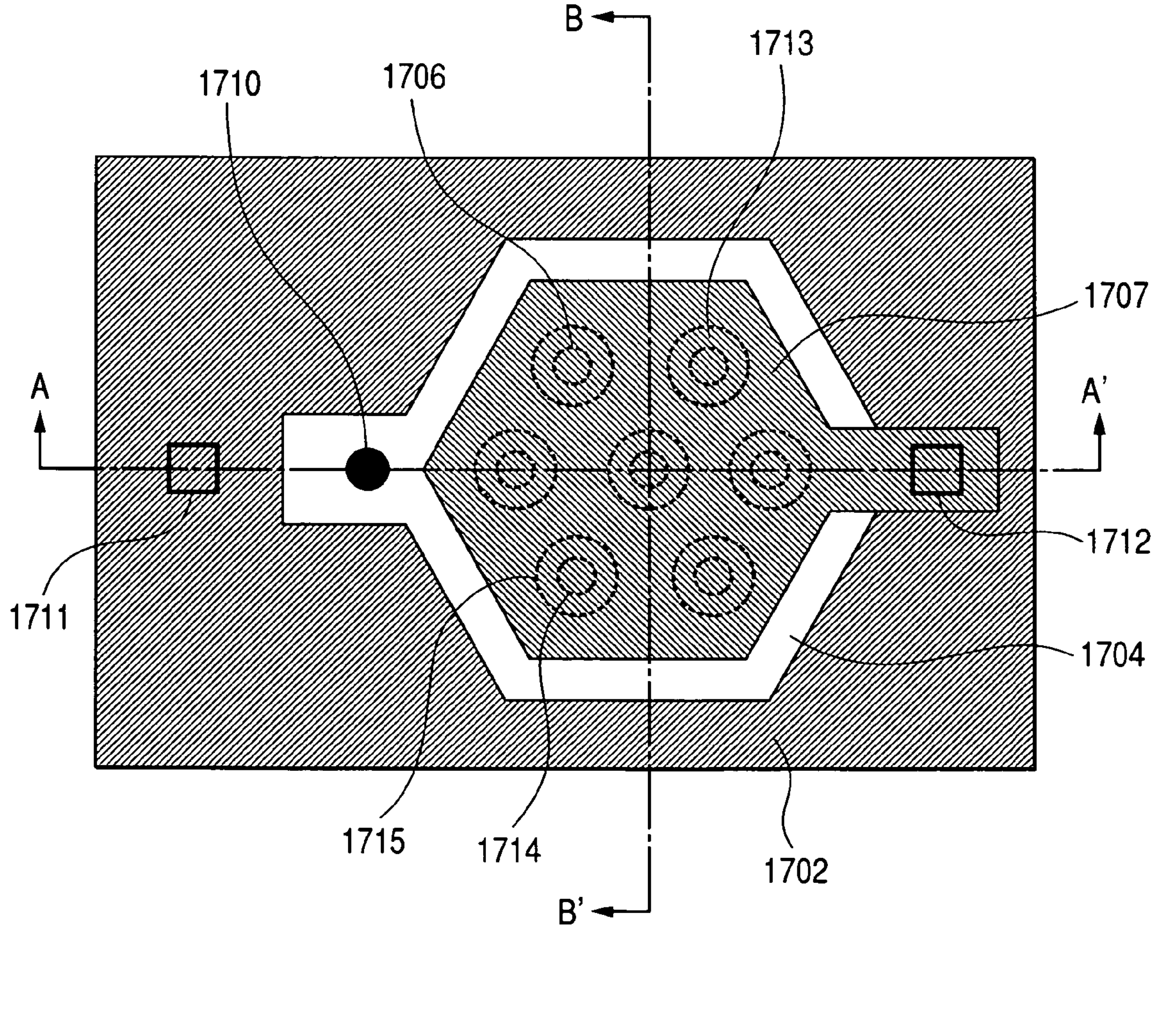
FIG. 16 is a top view of a cMUT according to a third embodiment of the invention.

FIG. 16 is a top view of a cMUT according to the third embodiment of the invention. In the drawing, reference numeral 1702 denotes a lower electrode, 1704 denotes a cavity layer, 1707 denotes an upper electrode, and 1710 denotes a wet etching hole for forming the cavity. That is, the wet etching hole 1710 is connected to the cavity layer 1704 forming a cavity. Reference numeral 1711 denotes an opening connected to the lower electrode 1702, and reference numeral 1712 denotes an opening connected to the upper electrode 1707. Although the insulating film is formed between the upper electrode 1707 and the cavity layer 1704 in a way to cover the cavity layer 1704 and the lower electrode 1702, it is not shown in the drawing to show the cavity Layer 1704 and the lower electrode 1702. Reference numeral 1706 denotes projections formed on the insulating film, and reference numeral 1713 denotes an opening formed on the upper electrode 1707. An opening 1713 is formed not to be superposed with the projections 1706. Reference numeral 1714 denotes an outer peripheral surface of the projections 1706, and reference numeral 1715 denotes an inner peripheral surface of the opening 1713.

Figure 17A:
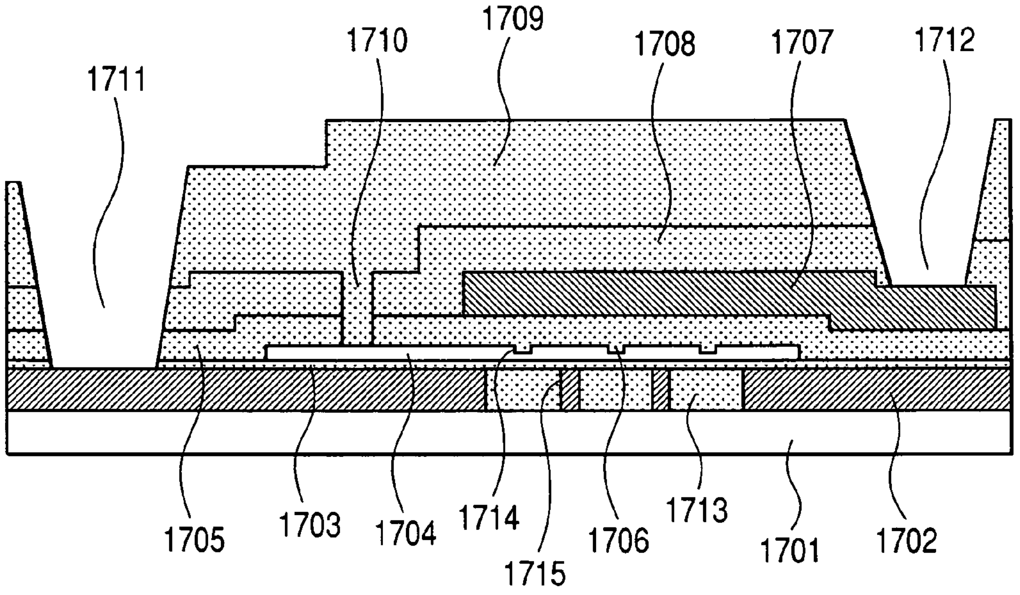
FIG. 17*a* is a cross-sectional view taken along line A-A' in FIG. 16.
Figure 17B:
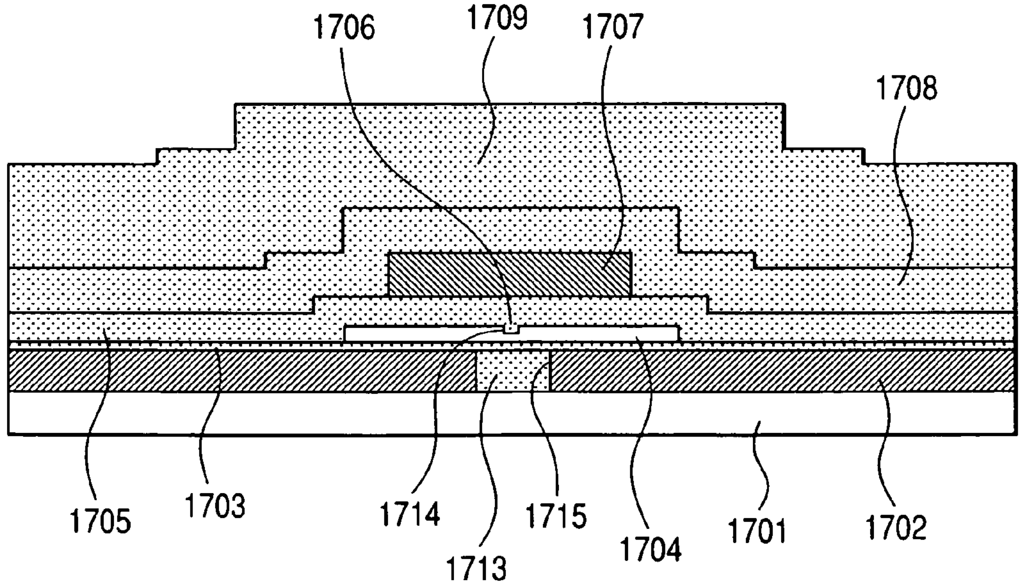
FIG. 17*b* is a cross-sectional view taken along line B-B' in FIG. 16.

FIG. 17*a* is a cross-sectional view taken along line A-A' in FIG. 16, and FIG. 17*b* is a cross-sectional view taken along line B-B' in FIG. 16. As shown in the drawings, the lower electrode 1702 of the cMUT is formed on the insulating film 1701 formed on a semiconductor substrate. The cavity layer (a cavity) 1704 is formed on the top of the lower electrode 1702 through an insulating film 1703. An insulating film 1705 is formed to encompass the cavity layer 1704, and the upper electrode 1707 is formed on the top of the insulating film 1705. The projections 1706 are formed on the cavity layer 1704 from the lower surface of the insulating film 1705. The opening 1713 is formed in the lower electrode 1702 below the projections 1706. An insulating film 1708 and an insulating film 1709 are formed on the top of the upper electrode 1707. Also, a wet etching hole 1710 is formed into the insulating film 1705 and the insulating film 1708, passing through these films. This wet etching hole 1710 is provided to form the cavity layer 1704, and once the cavity layer 1704 is formed it is filled up with the insulating film 1709. Reference numerals 1711 and 1712 denote openings for supplying a voltage to the lower electrode 1702 and the upper electrode 1707, respectively. Reference numeral 1714 denotes an outer peripheral surface of the projections 1706, and reference numeral 1715 denotes an inner peripheral surface of the opening 1713.

As shown in FIG. 16 and FIGS. 17*a* and 17*b*, the third embodiment is characterized in that the opening 1713 is formed into the lower electrode 1702 on the bottom of the projections 1706 that are protruded in the cavity layer 1704 on the lower surface of the insulating film 1505. With this structure, although a voltage making the lower surface of the insulating film 1705 come in contact with the insulating film 1703 that covers the upper surface of the lower electrode 1702 is applied to the upper electrode 1707 and the lower electrode 1702, the projections 1706 function as a support structure and it is possible to prevent the entire lower surface of the insulating film 1705 from contacting the insulating film 1703 that covers the lower electrode 1702. Moreover, by forming the opening 1713 into the lower electrode 1702, although the projections 1706 serve as a support structure, they are not inserted into the lower electrode 1702, and charge injection into the insulating films 1705 and 1703 of the projections 1706 can be substantially reduced. This, in turn, brings an improvement in the operating reliability of the cMUT.

Preferably, the distance from the outer peripheral surface 1714 of the projections 1706 to the inner peripheral surface 1715 of the opening 1713 seen from the top is set to be greater than the thickness of the insulating film 1705. By this, an electric field at the projections 1706 by the upper electrode 1707 and the lower electrode 1702 is much reduced and charge injection into the projections 1706.can be reduced a lot.

Now that the manufacturing method of the cMUT according to the third embodiment of the invention is almost identical with that of the first embodiment, except that the opening 1713 is formed into the lower electrode 1702 and filled up with the insulating film to be planarized, the explanation of the identical parts of the method will be omitted. The opening 1713 is formed into the lower electrode 1702 by photolithography technique and dry etching technique.

As explained so far, according to the cMUT of the third embodiment of the invention, although the membrane (insulating film 1705) contacts the lower electrode 1702, their contact area is reduced by the projections 1706 formed on the insulating film 1705, and charge injection into the insulating films 1705 and 1706 can be suppressed, thereby decreasing the variation of a voltage being used. Moreover, by arranging the projections 1706 and the upper electrode 1707 in a manner not to be superposed with each other, charge injection from the upper and lower electrodes 1707 and 1702 to the projections 1706 of the insulating films 1705 and 1703 can be prevented. In result, it is now possible to drive a cMUT with a voltage close to the collapse voltage and the sensitivity of the cMUT can be enhanced.

In addition, without using a complicated technique, such as wafer laminating technique, cost-effective cMUTs can be manufactured.

In FIG. 16, although the cMUT has a hexagonal shape, the shape is not limited thereto but other shapes like a circular shape can be used as well.

Even though seven projections and the opening in the upper electrode are formed in the cavity, the arrangement of the projections is not limited to the one shown in the drawing as long as the projections serve as a support structure for preventing the membrane from contacting the lower electrode in the case that a voltage greater than the collapse voltage is applied between the upper electrode and the lower electrode.

In addition, materials of the cMUT of the third embodiment of the invention are one of their combinations. And, tungsten or other conductive materials can be used as materials of the upper electrode and the lower electrode. Also, the sacrifice layer may be made from a material which can secure wet etching selectivity with other materials surrounding the sacrifice layer. Therefore, an SOG (Spin-on-Glass) film or a metallic film may be used in replacement of the polycrystalline silicon film.

According to the manufacturing method for the third embodiment of the invention, a cMUT can be manufactured on any planar surface. This means that the lower electrode can be a Si substrate, and part of the LSI wiring can be used as the lower electrode.

In conclusion, the ultrasonic transducer of the invention can be broadly used in the manufacture of semiconductor devices.

Although the preferred embodiment of the present invention has been described, it will be understood by those skilled in the art that the present invention should not be limited to the described preferred embodiment, but various changes and modifications can be made within the spirit and scope of the present invention as defined by the appended claims.

What is claimed is:

1. An ultrasonic transducer, comprising:

a first electrode;

a cavity formed over the first electrode;

an insulating film formed over the first electrode; and a second electrode formed over the cavity;

wherein the insulating film includes a projection extending in the cavity so that a portion of the cavity is disposed between the projection of the insulating film and the first electrode; and wherein, at least a portion of at least one of the first electrode and the second electrode has an opening corresponding with the projection of the insulating film, when viewed in plan view.

2. An ultrasonic transducer comprising:

a first electrode;

a cavity formed over the first electrode;

an insulating film formed over the cavity; and a second electrode formed on the insulating film, wherein the insulating film includes a projection extending in the cavity so that a portion of the cavity is disposed between the projection of the insulating film and the first electrode;

wherein at least a portion of at least one of the first electrode and the second electrode has an opening corresponding with the projection of the insulating film, when viewed in plan view.

3. The ultrasonic transducer of claim 2, wherein the insulating film has the projection extending therefrom into the cavity.

4. The ultrasonic transducer of claim 3, wherein the insulating film and the insulating film with the projections are silicon oxide films.

5. The ultrasonic transducer of claim 3, wherein a distance between an outer peripheral surface of the projection and an inner peripheral surface of an opening formed in one electrode is greater than a thickness of the insulating film.

6. A manufacturing method of an ultrasonic transducer, comprising:

forming a first electrode;

forming a sacrifice layer over the first electrode, the sacrifice layer having a bottom surface;

forming a recess in the sacrifice layer, the recess having a bottom surface, which is spaced from the bottom surface of the sacrifice layer;

forming a first insulating film which covers the sacrifice layer and forms a projection which extends into and fills the recess in the sacrifice layer;

forming a second electrode on the first insulating film;

forming a second insulating film which covers the second electrode and the first insulating film;

forming a hole in the first insulating film and the second insulating film which penetrates the first insulating film and the second insulating film so as to extend to the sacrifice layer; and removing the sacrifice layer through the hole, so as to form a cavity.

7. The method of claim 6, comprising:

forming an opening in a portion of the second electrode, wherein the opening corresponding with the projection of the first insulating film when viewed in plan view.

8. The method of claim 7, wherein a distance between an outer peripheral surface of the projection and an inner peripheral surface of the opening formed into the second electrode is greater than a thickness of the first insulating film.

9. The method of claim 6, comprising:

forming an opening into a portion of the first electrode, wherein the opening corresponding with the projection of the first insulating film when viewed in the plan view.

10. The method of claim 9, wherein a distance between an outer peripheral surface of the projection and an inner peripheral surface of the opening formed into the first electrode is greater than a thickness of the first insulating film.

* * * * *